US008827493B2

(12) United States Patent
Shimonishi et al.

(10) Patent No.: US 8,827,493 B2
(45) Date of Patent: Sep. 9, 2014

(54) LED MODULE FOR LIGHTING

(75) Inventors: Syota Shimonishi, Kiyosu (JP); Hiroyuki Tajima, Kiyosu (JP); Yosuke Tsuchiya, Kiyosu (JP); Hideaki Kato, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 370 days.

(21) Appl. No.: 13/330,892

(22) Filed: Dec. 20, 2011

(65) Prior Publication Data

US 2012/0155086 A1    Jun. 21, 2012

(30) Foreign Application Priority Data

Dec. 20, 2010    (JP) ................................. 2010-283739

(51) Int. Cl.
| | |
|---|---|
| *H05B 33/08* | (2006.01) |
| *H05K 1/02* | (2006.01) |
| *F21Y 105/00* | (2006.01) |
| *F21K 99/00* | (2010.01) |
| *F21V 25/10* | (2006.01) |
| *F21Y 101/02* | (2006.01) |

(52) U.S. Cl.
CPC .......... *H05K 1/026* (2013.01); *H05K 2203/162* (2013.01); *F21Y 2105/001* (2013.01); *F21K 9/00* (2013.01); *H05K 2201/09381* (2013.01); *H05B 33/0821* (2013.01); *F21V 25/10* (2013.01); *H05K 2201/2054* (2013.01); *F21Y 2101/02* (2013.01); *H05K 2201/10106* (2013.01); *Y02B 20/341* (2013.01); *H05K 1/0269* (2013.01)
USPC .................................................. 362/249.02

(58) Field of Classification Search
USPC .................................................. 362/249.02
See application file for complete search history.

(56) References Cited

U.S. PATENT DOCUMENTS 5,608,559 A * 3/1997 Inada et al. ................... 349/149
6,514,782 B1    2/2003 Wierer, Jr. et al.
(Continued)

FOREIGN PATENT DOCUMENTS

| JP | H01-287937 A | 11/1989 |
|---|---|---|
| JP | 9-51149 A | 2/1997 |

(Continued)

OTHER PUBLICATIONS

Notification of Reasons for Refusal dated Sep. 17, 2013, with English translation.

(Continued)

*Primary Examiner* — Laura Tso
(74) *Attorney, Agent, or Firm* — McGinn Ip Law Group, PLLC

(57) ABSTRACT

An object of the present invention is to provide a LED module, capable of protecting LED chips from an excessive voltage, at low cost.

An LED module for lighting includes a wiring substrate having a plurality of wiring patterns formed thereon, and a plurality of LED chips connected to the wiring patterns so as to constitute a series circuit or a series-parallel circuit. In the LED module, the wiring patterns comprises an anode side wiring pattern constituting an anode side electrode of the circuit, and a cathode side wiring pattern constituting a cathode side electrode of the circuit, the anode side wiring pattern and the cathode side wiring pattern are disposed to surround connection regions of the wiring patterns with the LED chips, and forms guard electrodes, and both edge portions of the anode side wiring pattern face both edge portions of the cathode side wiring pattern with gaps, respectively.

17 Claims, 5 Drawing Sheets

(56) References Cited

U.S. PATENT DOCUMENTS

| | | |
|---|---|---|
| 6,573,537 B1 | 6/2003 | Steigerwald et al. |
| 2002/0151200 A1 | 10/2002 | Fauser et al. |
| 2003/0053056 A1 | 3/2003 | Ohazama |
| 2003/0189829 A1 | 10/2003 | Shimizu et al. |
| 2005/0207165 A1 | 9/2005 | Shimizu et al. |
| 2005/0237747 A1 | 10/2005 | Shimizu et al. |
| 2005/0242362 A1 | 11/2005 | Shimizu et al. |
| 2006/0160409 A1 | 7/2006 | Shimizu et al. |
| 2007/0187708 A1 | 8/2007 | Setomoto et al. |
| 2011/0309392 A1 | 12/2011 | Wirth |

FOREIGN PATENT DOCUMENTS

| | | |
|---|---|---|
| JP | H09-064093 A | 3/1997 |
| JP | 2002-335014 A | 11/2002 |
| JP | 2003-086999 A | 3/2003 |
| JP | 2003-533013 A | 11/2003 |
| JP | 2006-310501 A | 11/2006 |
| JP | 2009-272378 A | 11/2009 |
| JP | 2010-056386 A | 3/2010 |
| JP | 2010-087071 A | 4/2010 |
| JP | 2010-251666 A | 11/2010 |
| WO | WO 03/016782 A1 | 2/2003 |
| WO | WO 2010/022699 A1 | 3/2010 |

OTHER PUBLICATIONS

Notification of Reasons for Refusal dated Jan. 7, 2014, with English translation.

* cited by examiner

US 8,827,493 B2

LED MODULE FOR LIGHTING

BACKGROUND OF THE INVENTION

1. Field of the Invention

The present invention relates to an LED module for lighting.

2. Description of the Related Art

In order to implement a high-luminous-flux light source. LED modules for lighting (LED lighting devices) having a plurality of LED chips mounted on a wiring substrate have been developed (see, for example, International Publication No. 03/016782).

LED modules for lighting are tested by applying a high voltage before shipment; however, in this test, an excessive voltage may be applied to LED chips such that the LED chips malfunction.

For this reason, in order to protect the LED chips from the excessive voltage, it may be considered to provide a protection circuit composed of a zener diode and so on, to a LED module for lighting; however, the cost of the LED module becomes high by the cost of the protection circuit.

SUMMARY OF THE INVENTION

The present invention was made to solve the problem, and an object of the present invention is to provide a LED module for lighting, capable of protecting LED chips from an excessive voltage, at low cost.

The inventors of the present invention diligently repeated examination to solve the problem and have found the following aspects of the present invention.

<First Aspect>

According to a first aspect of the present invention, an LED module for lighting includes a wiring substrate having a plurality of wiring patterns formed thereon, and a plurality of LED chips connected to the wiring patterns so as to constitute a series circuit or a series-parallel circuit. In the LED module, the wiring patterns comprises an anode side wiring pattern constituting an anode side electrode of the circuit, and a cathode side wiring pattern constituting a cathode side electrode of the circuit, the anode side wiring pattern and the cathode side wiring pattern are disposed to surround connection regions of the wiring patterns with the LED chips, and forms guard electrodes, and both edge portions of the anode side wiring pattern face both edge portions of the cathode side wiring pattern with gaps, respectively.

According to the first aspect, when the LED module for lighting is tested by applying a high voltage before shipment, discharge is carried out through the gaps between both edge portions of the anode side wiring pattern and both edge portions of the cathode side wiring pattern, such that the high voltage is not applied to the connection regions with the LED chips. Therefore, it is possible to prevent an excessive voltage from being applied to the LED chips, such that the LED chips 30 and 31 do not malfunction.

As a result, since it is not required to provide a protection circuit for protecting the LED chips from an excessive voltage, to the LED module for lighting, it is possible to provide the LED module for lighting at low cost.

<Second Aspect>

According to a second aspect of the present invention, in the LED module of the first aspect, clearance between outer peripheries of the anode side wiring pattern and the cathode side wiring pattern and an outer periphery of the wiring substrate is 1.5 mm or less.

In order to certainly achieve the operations and effects of the first aspect, it is preferable to make the surface areas of the anode side wiring pattern and the cathode side wiring pattern large, and it is advantageous to decrease the clearance between the outer peripheries of the corresponding wiring patterns and the outer periphery of the metal base, and the inventors of the present invention experimentally made sure that, if the clearance is set to 1.5 mm or less, the effects are practically and sufficiently achieved.

<Third Aspect>

According to a third aspect, in the LED module of the first or second aspect, a distributed Bragg reflector layer is formed on surfaces of the wiring patterns except for connection regions with the LED chips.

According to the first aspect, since the surface areas of the anode side wiring pattern and the cathode side wiring pattern become large, and the surfaces of the corresponding wiring patterns absorb light of the LED chips, the efficiency of light extraction from the LED chips is reduced.

Also, if the surfaces of the wiring patterns are exposed, problems such as migration and oxidation corrosion easily occur.

For these reasons, according to the third aspect, the distributed Bragg reflector layer is formed. Since the distributed Bragg reflector suppresses light of the LED chips from being absorbed in the surfaces of the wiring patterns, and reflects the light of the LED chips, it is possible to improve the efficiency of light extraction from the LED chips.

Further, since the distributed Bragg reflector layer functions as a protection layer for the wiring patterns, it is possible to prevent occurrence of problems such as migration and oxidation corrosion of the wiring patterns, so as to improve the reliability.

<Fourth Aspect>

According to a fourth aspect, in the LED module of any one of the first to third aspects, marks for recognition are formed by the both edge portions of the anode side wiring pattern and the both edge portions of the cathode side wiring pattern.

According to the fourth aspect, when the LED chips are mounted on the wiring substrate 20 by an automatic mounting machine, the wiring patterns can be used as marks for recognition of the automatic mounting machine for setting the mounting positions of the LED chips. Therefore, it is possible to reduce the cost as compared to a case where marks for recognition are separately provided.

<Fifth Aspect>

According to a fifth aspect, in the LED module of any one of the first to fourth aspects, the LED chips are disposed to be approximately symmetrical with respect to a point.

According to the fifth aspect, since it becomes possible to make light of the to LED chips uniform in a plane direction of the wiring substrate, uniform lighting light is obtained.

DETAILED DESCRIPTION OF PREFERRED EMBODIMENTS

Hereinafter, each of embodiments of the present invention will be described with reference to the accompanying drawings. Further, throughout the embodiments, identical component members and component elements are denoted by the same reference symbols, and the redundant description of the same contents will not be repeated.

<First Embodiment>

Figure 1:
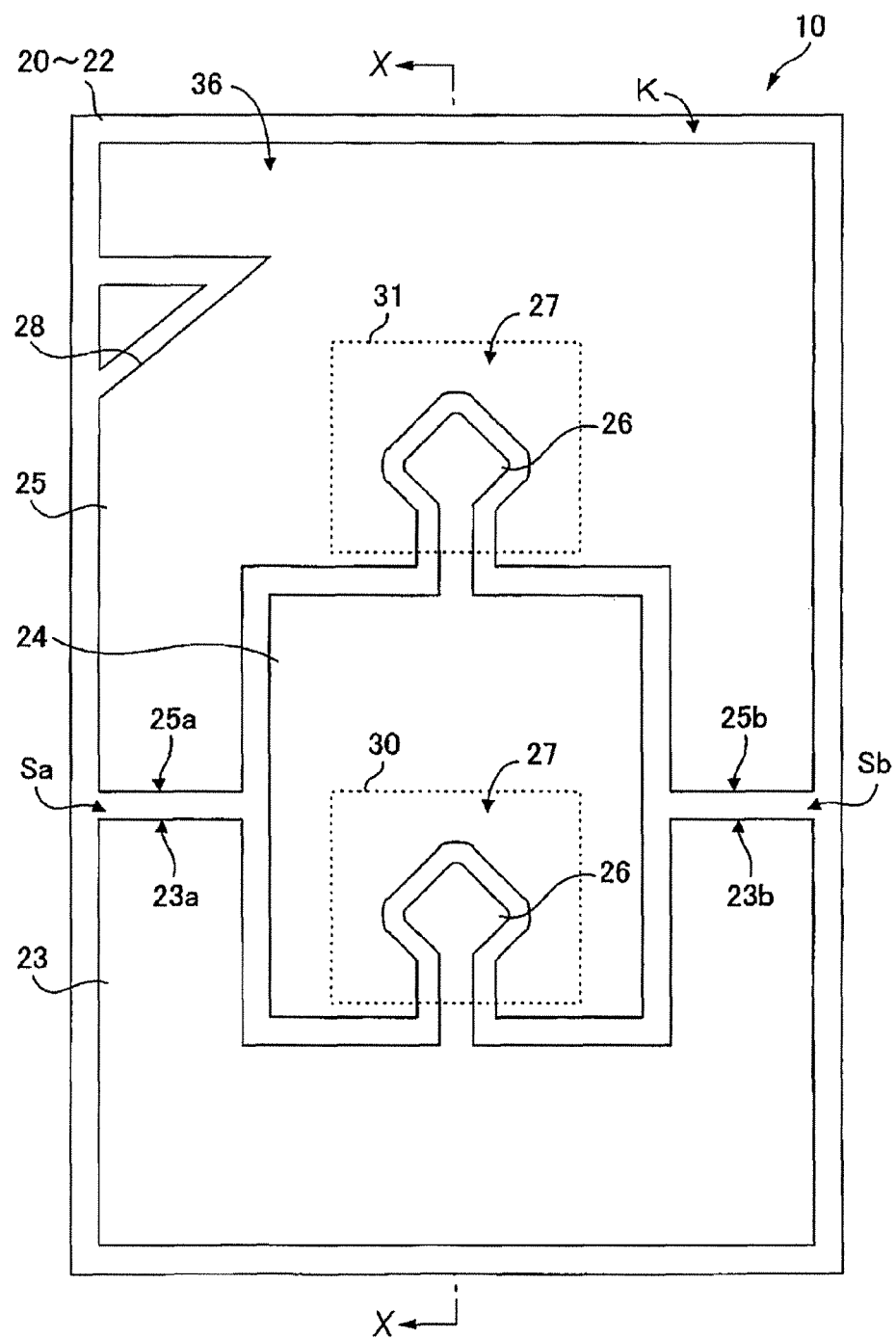
FIG. 1 is a plan view illustrating a schematic configuration of main parts of an LED module 10 for lighting according to a first embodiment of the present invention.

FIG. 1 is a plan view illustrating a schematic configuration of main parts of an LED module 10 for lighting according to a first embodiment of the present invention.

Figure 2:
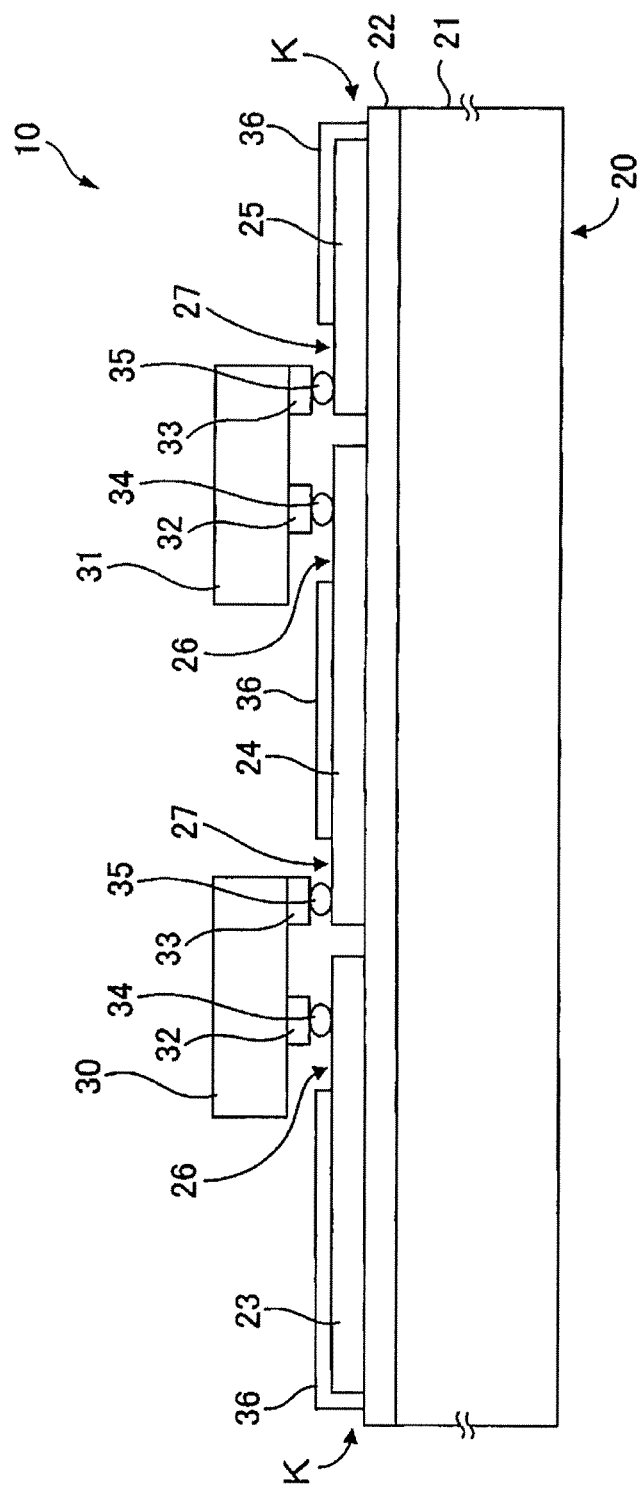
FIG. 2 is a vertical cross-sectional view illustrating the schematic configuration of the main parts of the LED module 10 for lighting, taken along a line X-X shown in FIG. 1.

FIG. 2 is a vertical cross-sectional view illustrating the schematic configuration of the main parts of the LED module 10 for lighting, taken along a line X-X shown in FIG. 1.

Figure 3:
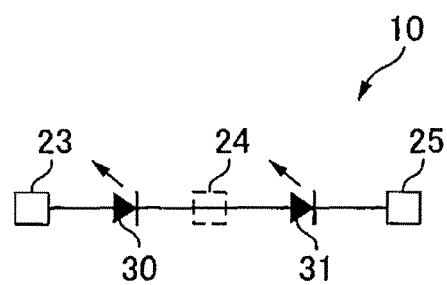
FIG. 3 is a circuit diagram illustrating a connection state of LED chips 30 and 31 constituting the LED module 10 for lighting.

FIG. 3 is a circuit diagram illustrating a connection state of LED chips 30 and 31 constituting the LED module 10 for lighting.

The LED module 10 for lighting includes a wiring substrate 20, the LED chips 30 and 31, anode side electrode pads 32, cathode side electrode pads 33, bumps 34 and 35, a distributed Bragg reflector (DBR) layer 36, and so on.

As shown in FIG. 2, the wiring substrate 20 includes a metal base 21, an insulating layer 22, and wiring patterns 23 to 25 having connection regions 26 and 27 and a cathode mark 28.

The metal base 21 is made of a plate material formed with a highly heat-conductive metal (such as aluminum, copper, stainless, and an alloy thereof), and radiates heat generated by the LED chips 30 and 31 mounted on the wiring substrate 20.

The insulating layer 22 is made of a thick layer of an insulating material (such as silicon oxide or aluminum oxide), to cover an entire surface of the metal base 21.

The wiring patterns 23 to 25 are made of a multilayer of highly conductive metals (such as a multilayer of layers made of copper, nickel, gold, and silver in this order from the bottom) on the insulating layer 22.

The DBR layer 36 is formed to the surfaces of the wiring patterns 23 to 25 so as to expose some regions, such that the exposed regions become the connection regions 26 and 27.

As shown in FIG. 2, the LED chips 30 and 31 having the same configuration are mounted on the wiring patterns 23 to 25 on the wiring substrate 20 by flip-chip mounting using the bumps 34 and 35.

That is, on the lower surface sides of the LED chips 30 and 31, the anode side electrode pads 32 and the cathode side electrode pads 33 are formed to be to respectively connected to P-type semiconductor regions (not shown) and N-type semiconductor regions (not shown) of the LED chips 30 and 31.

Then, the anode side electrode pad 32 of the LED chip 30 and a connection region 26 of the wiring pattern 23 are electrically connected to each other by a bump 34, and the cathode side electrode pad 33 of the LED chip 30 and a connection region 27 of a wiring pattern 24 are connected to each other by a bump 35.

Further, the anode side electrode pad 32 of the LED chip 31 and a connection region 26 of the wiring pattern 24 are electrically connected to each other by a bump 34, and the cathode side electrode pad 33 of the LED chip 31 and a connection region 27 of a wiring pattern 25 are connected to each other by a bump 35.

The bumps 34 and 35 are made of, for example, gold, solder, or the like.

As a result, as shown in FIG. 3, the LED chips 30 and 31 are connected in series between the wiring pattern 23 and the wiring pattern 25, with the wiring pattern 24 interposed between the LED chips 30 and 31, such that the wiring pattern (anode side wiring pattern) 23 constitutes an anode side electrode of the series circuit of the LED chips 30 and 31, and the wiring pattern (cathode side wiring pattern) 25 constitutes a cathode side electrode of the series circuit of the LED chips 30 and 31.

Then, the wiring patterns 23 and 25 are used as external electrodes of the series circuit of the LED chips 30 and 31.

As shown in FIG. 1, the connection region 26 of the wiring pattern 23 is approximately square-shaped, the corresponding connection region 26 is surrounded by the wiring pattern 24, with a gap having a constant width, and the corresponding connection region 26 and the wiring pattern 23 are connected to each other through a thin wiring pattern having a constant width.

Further, the connection region 26 of the wiring pattern 24 is approximately square-shaped, the corresponding connection region 26 is surrounded by the wiring pattern 25, with a gap having a constant width, and the corresponding connection to region 26 and the wiring pattern 24 are connected to each other through a thin wiring pattern having a constant width.

In other words, the wiring patterns 23 and 25 are formed to surround the connection regions 26 and 27 of the wiring patterns 23 to 25 to which the LED chips 30 and 31 are connected.

Further, a first edge portion 23a of the wiring pattern 23 and a first edge portion 25a of the wiring pattern 25 are formed to face each other with a gap Sa having a constant width.

Furthermore, a second edge portion 23b of the wiring pattern 23 and a second edge portion 25b of the wiring pattern 25 are formed to face each other with a gap Sb having a constant width.

Between the outer peripheries of the wiring patterns 23 and 25 and the outer periphery of the metal base 21, a uniform clearance K is provided along the peripherals of them.

The wiring pattern 25 has the cathode mark 28 formed by cutting a triangle shape into an edge face of the wiring pattern 25.

The cathode mark 28 is a mark for enabling a user of the LED module 10 for lighting to visually judge that the wiring pattern 25 is the cathode side electrode of the series circuit of the LED chips 30 and 31.

[Operations and Effects of First Embodiment]

According to the LED module 10 for lighting of the first embodiment, it is possible to achieve the following operations and effects.

[1-1] The wiring patterns 23 and 25 are disposed to surround the connection regions 26 and 27 with the LED chips 30 and 31 and form guard electrodes.

Both edge portions (the first edge portion 23a and the second edge portion 23b) of the wiring pattern 23 face both edge portions (the first edge portion 25a and the second edge portion 25b) of the wiring pattern 25 with the gaps Sa and Sb, respectively.

Therefore, when the LED module 10 for lighting is tested by applying a high voltage before shipment, discharge is carried out through the gaps Sa and Sb between the wiring patterns 23 and 25, such that the high voltage is not applied to the connection regions 26 and 27 with the LED chips 30 and 31. Therefore, it is possible to prevent an excessive voltage from being applied to the LED chips 30 and 31, such that the LED chips 30 and 31 do not malfunction.

In other words, the wiring patterns 23 and 25 function as the guard electrodes for preventing an excessive voltage from being applied to the LED chips 30 and 31.

As a result, since it is not required to provide a protection circuit for protecting the LED chips 30 and 31 from an excessive voltage, to the LED module 10 for lighting, it is possible to provide the LED module 10 for lighting at low cost.

[1-2] In order to certainly achieve the operations and effects of the item [1-1], it is preferable to make the surface areas of the wiring patterns 23 and 25 large, and it is advantageous to decrease the clearance K between the outer peripheries of the wiring patterns 23 and 25 and the outer periphery of the metal base 21, and the inventors of the present invention experimentally made sure that, if the clearance K is set to 1.5 mm or less, the effects are practically and sufficiently achieved.

Further, if the clearance K is uniformly set over the outer peripheries of the wiring patterns 23 and 25 and the outer periphery of the metal base 21, it becomes possible to make light reflected by the wiring patterns 23 and 25 uniform in a plane direction of the wiring substrate 20. Therefore, uniform lighting light is obtained.

[1-3] If the wiring patterns 23 and 25 are disposed to surround the connection regions 26 and 27 with the LED chips 30 and 31, since the surface areas of the wiring patterns 23 and 25 become large, and the surfaces of the wiring patterns 23 and 25 absorb light of the LED chips 30 and 31, the efficiency of light extraction from the LED chips 30 and 31 is reduced.

Also, if the surfaces of the wiring patterns 23 to 25 are exposed, problems such as migration and oxidation corrosion easily occur.

For these reasons, the DBR layer 36 is formed on the surfaces of the wiring patterns 23 to 25 except for the connection regions 26 and 27 with the LED chips 30 and 31.

The DBR layer 36 is a laminated layer formed by alternately laminating layers having different refractive indexes to satisfy Bragg's condition of diffraction with respect to the light emission wavelengths of the LED chips 30 and 31.

Therefore, the DBR layer 36 suppresses light of the LED chips 30 and 31 from being absorbed in the surfaces of the wiring patterns 23 to 25, and reflects the light of the LED chips 30 and 31. As a result, it is possible to improve the efficiency of light extraction from the LED chips 30 and 31.

Further, the DBR layer 36 functions as a protection layer for the wiring patterns 23 to 25. Therefore, it is possible to prevent occurrence of problems such as migration and oxidation corrosion of the wiring patterns 23 to 25, such that the reliability is improved.

<Second Embodiment>

Figure 4:
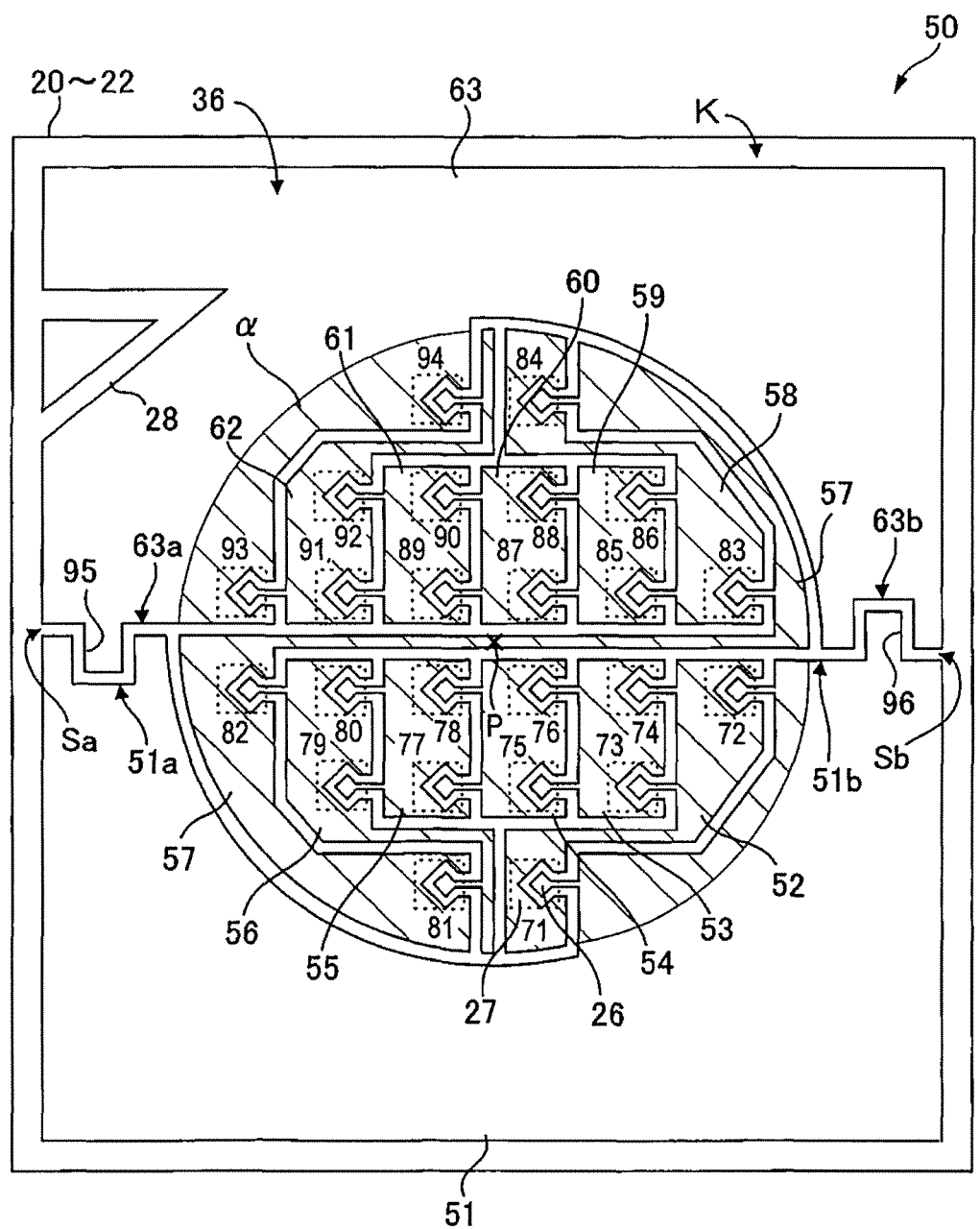
FIG. 4 is a plan view illustrating a schematic configuration of main parts of an LED module 50 for lighting according to a second embodiment of the present invention.

FIG. 4 is a plan view illustrating a schematic configuration of main parts of an LED module 50 for lighting according to a second embodiment of the present invention.

Figure 5:
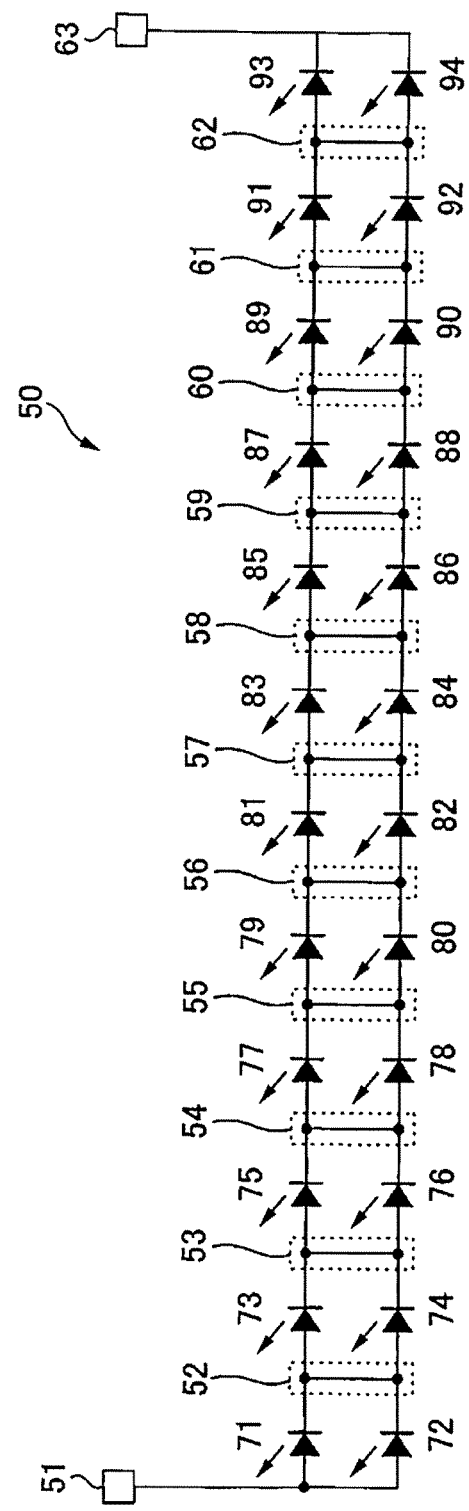
FIG. 5 is a circuit diagram illustrating a connection state of LED chips 71 to 94 constituting the LED module 50 for lighting.

FIG. 5 is a circuit diagram illustrating a connection state of LED chips 71 to 94 constituting the LED module 50 for lighting.

The LED module 50 for lighting includes a wiring substrate 20, anode side electrode pads 32, cathode side electrode pads 33, bumps 34 and 35, a DBR layer 36, LED chips 71 to 94, marks 95 and 96 for recognition, and so on. The wiring substrate 20 includes a metal base 21, an insulating layer 22, and wiring patterns 51 to 63 having connection regions 26 and 27 and a cathode mark 28.

The LED chips 71 to 94 have the same configuration as that of the LED chips 30 and 31 of the first embodiment, and the anode side electrode pads 32 and the cathode side electrode pads 33 are electrically connected to the connection regions 26 and 27 by the bumps 34 and 35, as in the first embodiment shown in FIG. 2.

In FIG. 4, the anode side electrode pads 32, the cathode side electrode pads 33, and the bumps 34 and 35 are not shown.

As shown in FIG. 5, the LED chips 71 to 94 are connected in series-parallel in a ladder shape between the wiring patterns 51 and 63, with the wiring patterns 52 to 62 interposed therebetween, such that the wiring pattern (anode side wiring pattern) 51 constitutes an anode side electrode of the series-parallel circuit of the LED chips 71 to 94, and the wiring pattern (cathode side wiring pattern) 63 constitutes a cathode side electrode of the series-parallel circuit of the LED chips 71 to 94.

Then, the wiring patterns 51 and 63 are used as external electrodes of the series-parallel circuit of the LED chips 71 to 94.

As shown in FIG. 4, the wiring patterns 51 and 63 are formed to surround the connection regions 26 and 27 of the wiring patterns 51 to 63 to which the LED chips 71 to 94 are connected.

Further, a first edge portion 51a of the wiring pattern 51 and a first edge portion 63a of the wiring pattern 63 are formed to face each other with a gap Sa having a constant width.

Furthermore, a second edge portion 51b of the wiring pattern 51 and a second edge portion 63b of the wiring pattern 63 are formed to face each other with a gap Sb having a constant width.

Between the outer peripheries of the wiring patterns 51 and 63 and the outer periphery of the metal base 21, a uniform clearance K is provided along the peripherals of them.

The wiring pattern 51 has the cathode mark 28 formed by cutting a triangle shape into an edge face of the wiring pattern 51.

The first edge portion 51a of the wiring pattern 51 and the first edge portion 63a of the wiring pattern 63 are formed to be bent in a U shape such that the U-shaped portions form the mark 95 for recognition, and the first edge portion 51b of the wiring pattern 51 and the first edge portion 63b of the wiring pattern 63 are formed to be bent in a U shape such that the U-shaped portions form the mark 96 for recognition.

The LED chips 71 to 94 are disposed to be approximately symmetrical with respect to the center point P of the wiring substrate 20.

[Operations and Effects of Second Embodiment]

According to the LED module 50 for lighting of the second embodiment, it is possible to achieve the following operations and effects, in addition to the operations and effects of the first embodiment.

[2-1] When the LED chips 71 to 94 are mounted on the wiring substrate 20 by an automatic mounting machine (not shown), the U-shaped marks 95 and 96 for recognition formed at the first and second edge portions of the wiring patterns 51 and 63 can be used as marks for recognition of the automatic mounting machine for setting the mounting positions of the LED chips 71 to 94.

Therefore, it becomes possible to use the wiring patterns 51 and 63 as the marks for recognition of the automatic mounting machine, and thus it is possible to reduce the cost as compared to a case where marks for recognition are separately provided.

Here, since the marks 95 and 96 for recognition are disposed at both edge portions in the vicinities of the outer periphery of the wiring substrate 20, respectively, and the U shape of one of the marks 95 and 96 for recognition is the inverted shape of the U shape of the other mark for recognition, the marks 95 and 96 for recognition certainly function as marks for recognition of the automatic mounting machine.

[2-2] The LED chips 71 to 94 are disposed to be approximately symmetrical with respect to the center point P of the wiring substrate 20.

Therefore, it becomes possible to make light of the LED chips 71 to 94 uniform in the plane direction of the wiring substrate 20. As a result, uniform lighting light is obtained.

In the example shown in FIG. 4, the LED chips 71 to 94 are disposed in a reticular pattern; however, the LED chips 71 to 94 may be disposed on the circumferences of a plurality of concentric circles having the centers at the center point P.

[2-3] Layers made of silver may be provided as the uppermost layers of the wiring patterns 51 to 63 only in a circular area a of the wiring patterns 51 to 63 shown as a hatched portion in FIG. 4.

In this case, outstanding light emission can be achieved in the circular area a by reflection of the layers made of Silver.

<Other Embodiments>

The present invention is not limited by the embodiments, but may be embodied as follows. Even in these cases, the same or further operations and effects as or than those of each of the first and second embodiments can be achieved.

[1] A wire bonding method may be used to connect the LED chips 30 and 31 to the connection regions 26 and 27 of the wiring patterns 23 to 25 or to connect the LED chips 71 to 94 to the connection regions 26 and 27 of the wiring patterns 51 to 63.

[2] The shape of the marks 95 and 96 for recognition is not limited to the U shape, but the marks 95 and 96 for recognition may be formed in any shape (such as a triangle shape or a saw-tooth shape) enabling recognition of the automatic mounting machine.

[3] The base of the wiring substrate 20 is not limited to the metal base 21, but may be an insulating base made of an inorganic material such as aluminum nitride or aluminum oxide or an organic material such as glass epoxy.

In this case, since it is not required to provide the insulating layer 22 on the insulating base, the wiring patterns 23 to 25 or 51 to 63 can be provided directly on the insulating base.

[4] The DBR layer 36 may be replaced with a translucent layer such as a single layer made of silicon oxide. In this case, a white pigment such as titanium oxide may be mixed in the translucent layer such that the translucent layer becomes a white layer.

The present invention is not limited in any way by the aspects and the embodiments described above. Various modifications that may be easily made by those skilled in the art without departing from the scope of the claims fall within the scope of the present invention. The contents of all the papers, patent application publications, and patent Publications specified herein are incorporated by reference in their entirety.

What is claimed is:

1. An LED module for lighting, the LED module comprising:
   a wiring substrate having a plurality of wiring patterns formed thereon; and
   a plurality of LED chips connected to the wiring patterns so as to constitute a series circuit or a series-parallel circuit,
   wherein the wiring patterns comprise an anode side wiring pattern constituting an anode side electrode of the circuit, and a cathode side wiring pattern constituting a cathode side electrode of the circuit,
   wherein the anode side wiring pattern and the cathode side wiring pattern are disposed to surround connection regions of the other wiring patterns with the LED chips, and forms guard electrodes, and
   wherein both edge portions of the anode side wiring pattern face both edge portions of the cathode side wiring pattern with gaps, respectively.

2. The LED module for lighting according to claim 1, wherein a clearance between outer peripheries of the anode side wiring pattern and the cathode side wiring pattern and an outer periphery of the wiring substrate is 1.5 mm or less.

3. The LED module for lighting according to claim 1, wherein a distributed Bragg reflector layer is formed on surfaces of the wiring patterns except for connection regions with the LED chips.

4. The LED module for lighting according to claim 1, wherein marks for recognition are formed by the both edge portions of the anode side wiring pattern and the both edge portions of the cathode side wiring pattern.

5. The LED module for lighting according to claim 1, wherein the LED chips are disposed to be approximately symmetrical with respect to a point.

6. The LED module for lighting according to claim 1, further comprising:
   a plurality of bumps,
   wherein the plurality of LED chips are mounted on the wiring patterns by flip-chip mounting via the plurality of bumps.

7. The LED module for lighting according to claim 1, further comprising:
   a plurality of bumps,
   wherein the anode side wiring pattern and the cathode side wiring pattern are electrically connected to the connection regions via the plurality of bumps.

8. The LED module for lighting according to claim 1, wherein the connection regions have a substantially square shape.

9. The LED module for lighting according to claim 1, wherein the gaps have a constant width.

10. The LED module for lighting according to claim 1, wherein a clearance between outer peripheries of the anode side wiring pattern and the cathode side wiring pattern and an outer periphery of the wiring substrate is uniformly set.

11. The LED module for lighting according to claim 1, wherein an edge portion of the anode side wiring pattern and an edge portion of the cathode side wiring pattern are configured as a U-shaped portion such that the U-shaped portion forms a mark for recognition.

12. The LED module for lighting according to claim 1, wherein a first edge portion of the anode side wiring pattern and a first edge portion of the cathode side wiring pattern in a vicinity of an outer periphery of the wiring substrate are configured as a first U-shape portion,
   wherein a second edge portion of the anode side wiring pattern and a second edge portion of the cathode side wiring pattern in a vicinity of an outer periphery of the wiring substrate are configured as a second U-shape that is an inverted shape of the first U-shape portion,
   wherein the first U-shaped portion and the second U-shaped portion each form a mark for recognition.

13. The LED module for lighting according to claim 1, wherein the wiring substrate further includes a base for radiating heat generated by the LED chips.

14. The LED module for lighting according to claim 13, wherein the base comprises an inorganic material.

15. The LED module for lighting according to claim 1, wherein a translucent layer is formed on surfaces of the wiring patterns except for connection regions with the LED chips.

16. The LED module for lighting according to claim 3, where the distributed Bragg reflector layer comprises a laminated layer formed by alternately laminating layers having different refractive indexes.

17. An LED module for lighting, the LED module comprising:
- a wiring substrate having a plurality of wiring patterns formed thereon; and
- a plurality of LED chips connected to the wiring patterns so as to constitute a series circuit or a series-parallel circuit,
- wherein the wiring patterns comprise an anode side wiring pattern constituting an anode side electrode of the circuit, and a cathode side wiring pattern constituting a cathode side electrode of the circuit,
- wherein connection regions of the other wiring patterns with the LED chips are disposed between the anode side wiring pattern and the cathode side wiring pattern such that the anode side wiring pattern and the cathode side wiring pattern form guard electrodes, and
- both edge portions of the anode side wiring pattern face both edge portions of the cathode side wiring pattern with gaps, respectively.

* * * * *